(12) United States Patent
Hwang et al.

(10) Patent No.: US 10,741,777 B2
(45) Date of Patent: Aug. 11, 2020

(54) STRETCHABLE DISPLAY (71) Applicant: ELECTRONICS AND TELECOMMUNICATIONS RESEARCH INSTITUTE, Daejeon (KR)

(72) Inventors: Chi-Sun Hwang, Daejeon (KR); Seung Youl Kang, Daejeon (KR); Byoung-Hwa Kwon, Daejeon (KR); Gi Heon Kim, Daejeon (KR); Seong Hyun Kim, Daejeon (KR); Jaehyun Moon, Daejeon (KR); Young Sam Park, Daejeon (KR); Seongdeok Ahn, Daejeon (KR); Jeong Ik Lee, Daejeon (KR); Sung Haeng Cho, Cheongju-si (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 16/204,869

(22) Filed: Nov. 29, 2018

(65) Prior Publication Data

US 2019/0221761 A1  Jul. 18, 2019

(30) Foreign Application Priority Data

Jan. 17, 2018  (KR) .................. 10-2018-0006254

(51) Int. Cl.
*H01L 51/00* (2006.01)
*H01L 51/52* (2006.01)
(Continued)

(52) U.S. Cl.
CPC ............ *H01L 51/0097* (2013.01); *B32B 7/12* (2013.01); *B32B 27/08* (2013.01);
(Continued)

(58) Field of Classification Search
CPC . H01L 51/0097; H01L 51/5253; H01L 51/56; H01L 51/0003; H01L 27/3276; H01L 2251/5338; H01L 2227/326
See application file for complete search history.

(56) References Cited

U.S. PATENT DOCUMENTS 7,491,892 B2  2/2009  Wagner et al.
8,912,094 B2  12/2014  Koo et al.
(Continued)

FOREIGN PATENT DOCUMENTS

KR  10-2014-0060822 A  5/2014
KR  10-2015-0138912 A  12/2015

*Primary Examiner* — Mohammed Shamsuzzaman
*Assistant Examiner* — Aaron J Gray
(74) *Attorney, Agent, or Firm* — Rabin & Berdo, P.C.

(57) ABSTRACT

Provided is a stretchable display including an elastic body, a light emitting unit on the elastic body, and a wiring unit on the elastic body, wherein the light emitting unit includes a first substrate unit on the elastic body, a buffer layer on the first substrate unit, and a light emitting element on the buffer layer, the wiring unit includes a second substrate unit on the elastic body, a driving element configured to control the light emitting element, a wiring configured to electrically connect the driving element and the light emitting element, and an insulation layer configured to cover the driving element and the wiring, the light emitting unit and the wiring unit have respective corrugation structures, a thickness of the light emitting unit is larger than that of the wiring unit, a modulus of elasticity of the buffer layer is larger than that of the insulation layer, and a modulus of elasticity of the elastic body is smaller than that of the insulation layer.

13 Claims, 5 Drawing Sheets

(51) Int. Cl.
  *H01L 51/56* (2006.01)
  *H01L 27/32* (2006.01)
  *B32B 7/12* (2006.01)
  *B32B 27/08* (2006.01)

(52) U.S. Cl.
  CPC ...... *H01L 27/3276* (2013.01); *H01L 51/5253* (2013.01); *H01L 51/56* (2013.01); *B32B 2457/206* (2013.01); *H01L 51/003* (2013.01); *H01L 2227/326* (2013.01); *H01L 2251/5338* (2013.01)

(56) References Cited

U.S. PATENT DOCUMENTS

| | | | |
|---|---|---|---|
| 9,331,126 | B2 | 5/2016 | Lee et al. |
| 2002/0182968 | A1* | 12/2002 | Yamazaki ........... H01L 51/0013 445/24 |
| 2006/0269754 | A1* | 11/2006 | Hayashi ............... A61L 17/145 428/411.1 |
| 2010/0059863 | A1 | 3/2010 | Rogers et al. |
| 2015/0263235 | A1* | 9/2015 | Shin .................... H01L 27/1237 257/72 |
| 2015/0349136 | A1 | 12/2015 | Koo et al. |
| 2016/0274391 | A1 | 9/2016 | Kang et al. |
| 2017/0278920 | A1* | 9/2017 | Park .................... H01L 51/5246 |
| 2018/0145124 | A1* | 5/2018 | Kim .................... H01L 27/3258 |

* cited by examiner

STRETCHABLE DISPLAY

CROSS-REFERENCE TO RELATED APPLICATIONS

This U.S. non-provisional patent application claims priority under 35 U.S.C. § 119 of Korean Patent Application No. 10-2018-0006254, filed on Jan. 17, 2018, the entire contents of which are hereby incorporated by reference.

BACKGROUND

The present disclosure herein relates to a stretchable display. More particularly, the present invention relates to a stretchable display in which a period of corrugation of a light emitting unit is larger than that of a wiring unit.

An electronic element, in particular, a display element is required to be stretchable in order to be applied to a 3-dimensionally curved (convex or concave) surface. Most of an insulation film, a conductive material, and a semiconductor film configuring an electronic element do not have stretchability, and thus a scheme for improving the shape of the electronic element to implement the stretchability is being proposed.

As one of the schemes for improving the shape of the electronic device to implement the stretchability, there is a scheme for making the electronic element very thin to form a corrugation structure. Such an electronic element may be elongated until the corrugation is completely stretched.

SUMMARY

The present disclosure provides a stretchable display in which a change amount of light emitting characteristics, such as a change amount of color coordinates or luminance, of a light emitting element according to stretch or recovery of the light emitting element is minimized.

An embodiment of the inventive concept provides a stretchable display including: an elastic body; a light emitting unit on the elastic body; and a wiring unit on the elastic body, wherein the light emitting unit includes: a first substrate unit on the elastic body; a buffer layer on the first substrate unit; and a light emitting element on the buffer layer, the wiring unit includes: a second substrate unit on the elastic body; a driving element configured to control the light emitting element; a wiring configured to electrically connect the driving element and the light emitting element; and an insulation layer configured to cover the driving element and the wiring, the light emitting unit and the wiring unit have respective corrugation structures, a thickness of the light emitting unit is larger than that of the wiring unit, a modulus of elasticity of the buffer layer is larger than that of the insulation layer, and a modulus of elasticity of the elastic body is smaller than that of the insulation layer.

In an embodiment, a thickness of the buffer layer may be larger than that of the insulation layer.

In an embodiment, a corrugation period of the light emitting unit may be larger than that of the wiring unit.

In an embodiment, the buffer layer may include one of an inorganic material and an organic and inorganic composite material, and the insulation layer may include a polymer resin.

In an embodiment, a thickness of the light emitting unit may be larger 10 times to 100 times than that of the wiring unit.

In an embodiment, a thickness of the buffer layer may be larger 10 times to 100 times than that of the insulation layer.

In an embodiment, the first substrate unit and the second substrate unit may include one among a polyimide resin, a polyethylene terephthalate (PET) resin, a polyethersulfone (PES) resin, and a ploycarbonate resin In an embodiment, the wiring unit may surround the light emitting unit in a planar manner.

In an embodiment, the light emitting unit may further include a first encapsulation unit configured to cover the light emitting element, and the wiring unit may further include a second encapsulation layer configured to cover the insulation layer.

In an embodiment, a top portion of the elastic body may have adhesive property.

In an embodiment, the stretchable display may further include an adhesive layer provided between the elastic body and the first substrate unit and between the elastic body and the second substrate unit.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Advantages and features of the present invention, and methods for achieving the same will be cleared with reference to exemplary embodiments described later in detail together with the accompanying drawings. However, the present invention is not limited to the following exemplary embodiments, but realized in various forms. In other words, the present exemplary embodiments are provided just to complete disclosure the present invention and make a person having an ordinary skill in the art understand the scope of the invention. The present invention should be defined by only the scope of the accompanying claims. Throughout this specification, like numerals refer to like elements.

The terminology used herein is for the purpose of describing particular embodiments only and is not intended to limit the scope of the present disclosure. As used herein, the singular forms "a", "an" and "the" are intended to include the plural forms as well, unless the context clearly indicates otherwise. It will be further understood that the terms "comprises" and/or "comprising" used herein specify the presence of stated components, operations and/or elements but do not preclude the presence or addition of one or more other components, operations and/or elements.

Hereinafter, embodiments of the inventive concept will be described in more detail with reference to the accompanying drawings.

Figure 1:
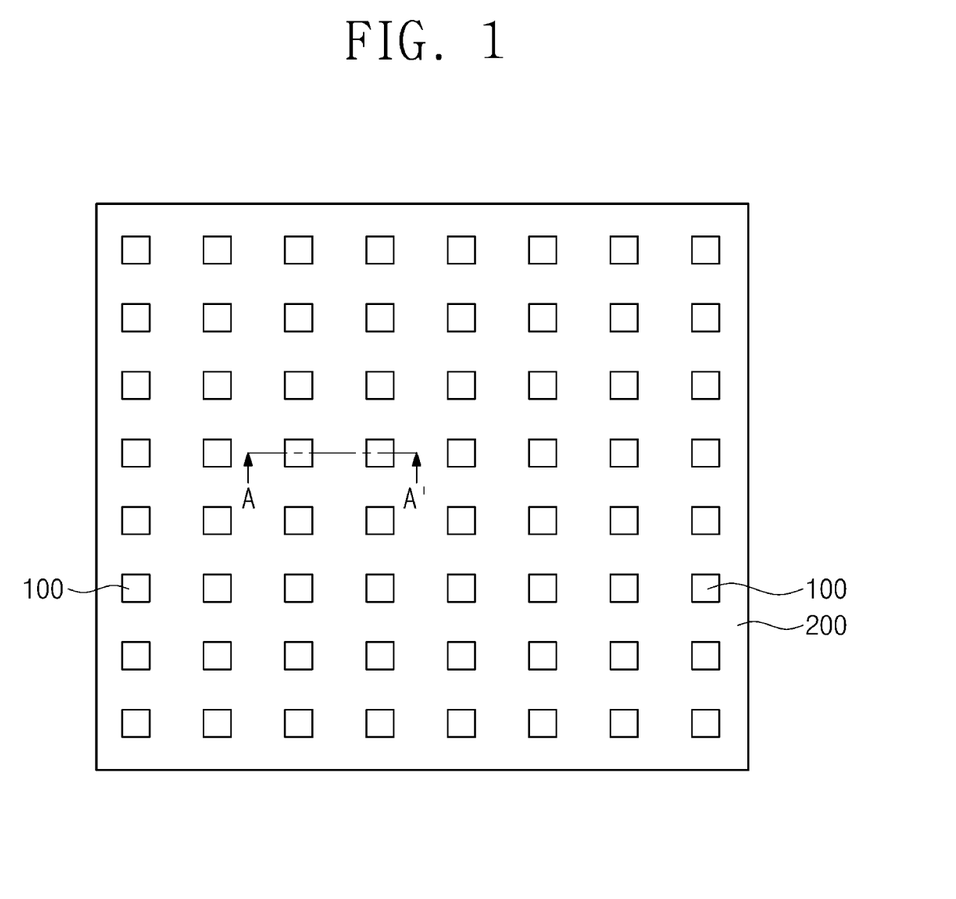
FIG. 1 is a plan view of a stretchable display according to an embodiment of the inventive concept.
Figure 2A:
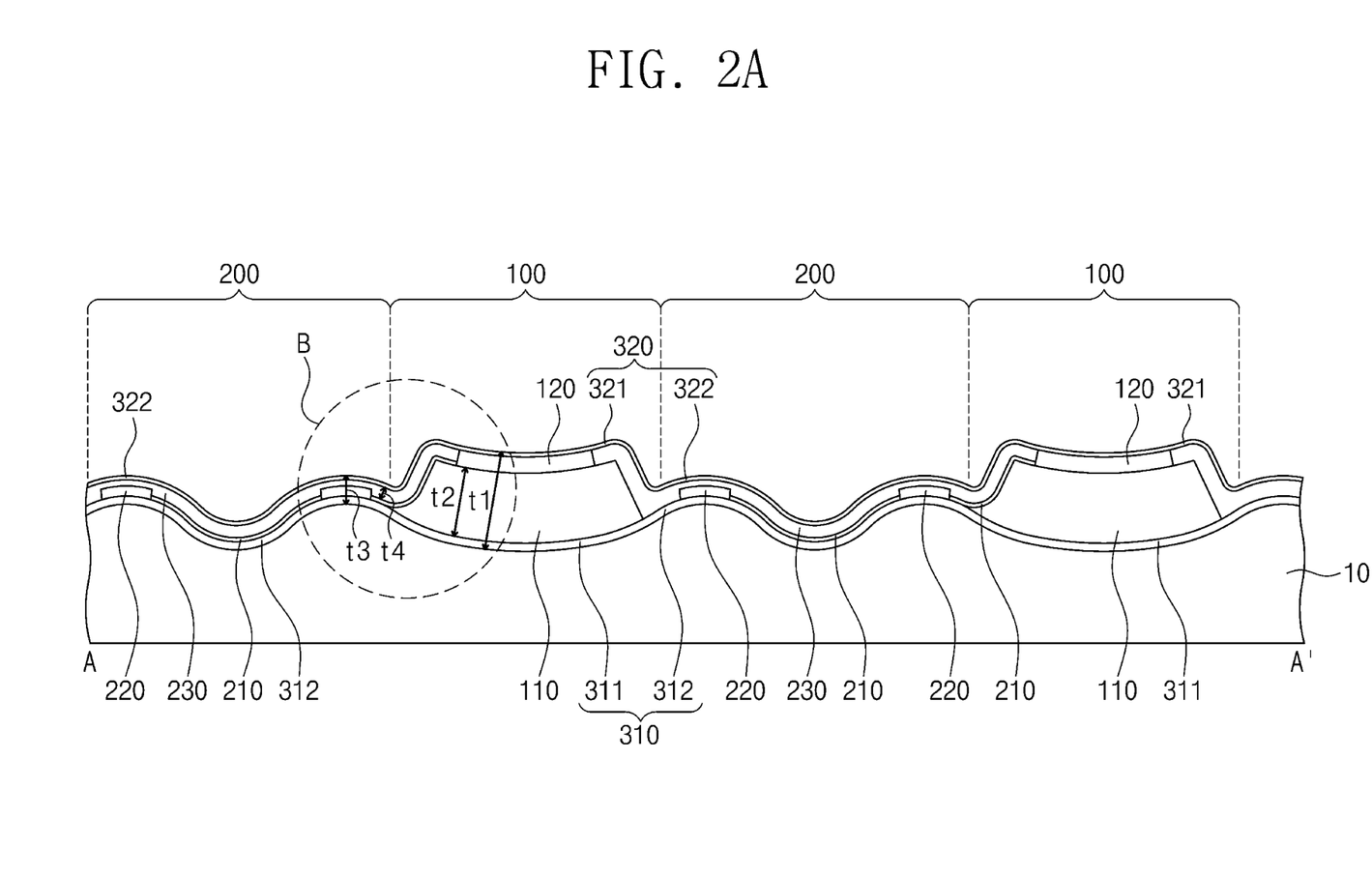
FIG. 2A is a cross-sectional view taken along a line A-A' of FIG. 1.
Figure 2B:
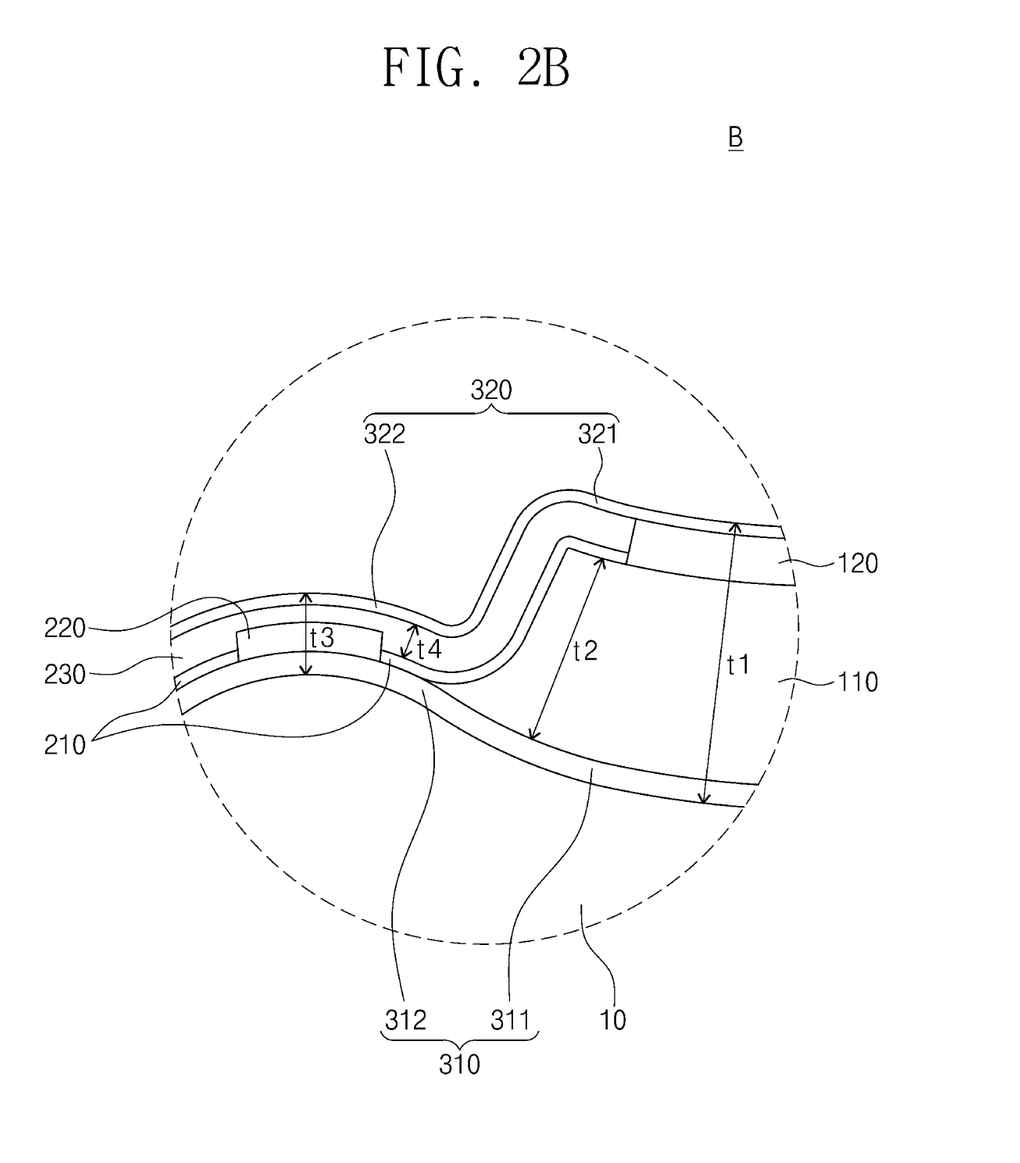
FIG. 2B is an enlarged view of a region B of FIG. 2A.

FIG. 1 is a plan view of a stretchable display according to an embodiment of the inventive concept, FIG. 2A is a cross-sectional view taken along a line A-A' of FIG. 1, and FIG. 2B is an enlarged view of a region B of FIG. 2A.

With reference to FIGS. 1, 2A and 2B, the stretchable display according to embodiments of the inventive concept may include an elastic body 10, a light emitting unit 100 and a wiring unit 200. The light emitting unit 100 and the wiring unit 200 may be provided on the elastic body 10. The light emitting unit 100 may be provided in plurality. The plurality of light emitting units 100 may be separated from each other in a planar manner. The wiring unit 200 may surround each of the light emitting units 100 in a planar manner. In other words, the wiring unit 200 may fill spaces between the plurality of light emitting units 100.

The light emitting unit 100 may be provided on the elastic body 10. The elastic body 10 may be configured from a material having the relatively lower modulus of elasticity. For example, the elastic body 10 may include Polydimethylsiloxane (PDMS). For example the modulus of elasticity of the elastic body 10 may be 10 MPa to 100 MPa. The light emitting unit 100 may include a first substrate unit 311, a buffer layer 110, a light emitting element 120 and a first encapsulation unit 321.

The buffer layer 110 may be provided on the first substrate unit 311. The thickness t2 of the buffer layer 110 may be relatively larger than that of the first substrate unit 311 and the first encapsulation unit 321. For example, the thickness t2 of the buffer layer 110 may be larger 10 time to 100 times than that of the first substrate unit 311 and the first encapsulation unit 321. For example, the buffer layer 110 may include an organic material. The organic material may be one of an acrylic resin and a silicon resin. For example, the buffer layer 110 may include an inorganic material. The inorganic material may be one among a metal oxide, a silicon oxide, or a silicon nitride. For another example, the buffer layer 110 may include an organic and inorganic composite material. The organic and inorganic composite material may include one among a metal oxide, a silicon oxide, or a silicon nitride, and one among an acrylic resin or a silicon resin.

The light emitting unit 120 may be provided on the buffer layer 110. For example, the light emitting element 120 may be an organic light emitting diode (OLED) or a quantum dot light emitting diode (QLED). The first encapsulation unit 321 may be provided to cover the top surface of the light emitting element 120. The first encapsulation unit 321 may be configured to protect the light emitting element 120.

The wiring unit 200 may be provided on the elastic body 10. The wiring unit 200 may include a second substrate unit 312, a wiring 210, a driving element 220, an insulation layer 230, and a second encapsulation unit 322.

The wiring 210 and the driving element 220 may be provided on the second substrate unit 312. A plurality of driving elements 220 may be provided in the wiring unit 200. For example, the driving element 220 may be thin film transistor (TFT). The driving element 220 may control the light emitting element 120. A plurality of wirings 210 may be provided in the wiring unit 200. A part of the wirings 210 may electrically connect two driving elements 220 to each other. Another part of the wirings 210 may electrically connect the driving element 220 and the light emitting element 120 to each other. For example, the wiring 210 may include a metal.

The insulation layer 230 may be provided to cover the wiring 210 and the driving element 220. For example, the insulation layer 230 may include a polymer resin. The thickness t4 of the insulation layer 230 may be relatively smaller than the thickness t2 of the buffer layer 110 of the light emitting unit 100. For example, the thickness t4 of the insulation layer 230 may be smaller 10 times to 100 times than the thickness t2 of the buffer layer 110. The second encapsulation unit 322 may be provided to cover the top surface of the light emitting element 230. The second encapsulation unit 322 may be configured to protect the light emitting element 230.

The first substrate unit 311 of the light emitting unit 100 and the second substrate unit 312 of the wiring unit 200 may integrally configure one substrate 310. The thicknesses of the first substrate 311 and the second substrate 312 may be identical. For example, the substrate 310 may include one among a polyimide resin, a polyethylene terephthalate (PET) resin, a polyethersulfone (PES) resin, and a ploycarbonate resin.

The first encapsulation unit 321 of the light emitting unit 100 and the second encapsulation unit 322 of the wiring unit 200 may integrally configure one encapsulation layer 320. The thicknesses of the first encapsulation unit 321 and the thickness of the second encapsulation unit 322 may be identical. For example, the encapsulation layer 320 may include aluminum oxide. The encapsulation layer 320 may be transparent.

In a stretchable display according to an embodiment of the inventive concept, each of the light emitting unit 100 and the wiring unit 200 may have a corrugation structure. In other words, the light emitting unit 100 and the wiring unit 200 may be bended in a water wave type. Accordingly, the first substrate unit 311, buffer layer 110, the light emitting element 120, and the first encapsulation unit 321 of the light emitting unit 100 may be bended in a water wave type, and the second substrate unit 312, the wiring 210, the driving element 220, the insulation layer 230, and the second encapsulation unit 322 of the wiring unit 200 may be bended in a water wave type. As illustrated, the wiring unit 200 may be further bended than the light emitting unit 100. In other words, a period of the corrugation of the light emitting unit 100 may be larger than that of the wiring unit 200. That the corrugation period of the light emitting unit 100 is larger than that of the wiring unit 200 may be a result according to the following Equation (1).

$$\lambda = 2\pi h_f (E_f/3E_s)^{1/3} \quad (1)$$

Equation (1) is a relational equation for the corrugation period λ. The corrugation periods λ of the light emitting unit 100 and the wiring unit 200 may be determined according to Equation (1).

For the light emitting unit 100, λ denotes the corrugation period of the light emitting unit 100, $h_f$ denotes the thickness t1 of the light emitting unit 100, $E_f$ denotes the modulus of elasticity of the light emitting unit 100, and $E_s$ denotes the modulus of the elasticity of the elastic body 10. The modulus of the light emitting unit 100 may be determined according to the moduli of elasticity of the first substrate unit 311, the buffer layer 110, the light emitting element 120 and the first encapsulation unit 321 included in the light emitting unit 100. For the light emitting unit 100, the thickness t2 of the buffer layer 110 may be relatively larger than the thickness t4 of the insulation layer 230, and relatively larger than the thickness of the substrate 310 and the encapsulation layer 320. Accordingly, the thickness t1 of the light emitting unit 100 may be relatively larger than the thickness t3 of the wiring unit 200. For example, the thickness t1 of the light emitting unit 100 may be larger 10 times to 100 times than the thickness t3 of the wiring unit 200. Since the thickness t1 of the light emitting unit 100 is larger than the thickness t3 of the wiring unit 200, according to Equation (1), the corrugation period of the light emitting unit 100 may be larger than that of the wiring unit 200. In other words, the wiring unit 200 may be further bended than the light emitting unit 100.

For the wiring unit 200, λ denotes the corrugation period of the wiring unit 200, $h_f$ denotes the thickness t3 of the wiring unit 200, $E_f$ denotes the modulus of elasticity of the wiring 200, and $E_s$ denotes the modulus of the elasticity of the elastic body 10. The modulus of the wiring unit 200 may be determined according to the moduli of elasticity of the second substrate unit 312, the wiring 210, the driving element 220, the insulation layer 230, and the second encapsulation unit 322 included in the wiring unit 200. For the wiring unit 200, the thickness t4 of the insulation layer 230 may be relatively smaller than the thickness t2 of the buffer layer 110. Accordingly, the thickness t3 of the wiring unit 200 may be relatively smaller than the thickness t1 of the light emitting unit 100. For example, the thickness t3 of the wiring unit 200 may be smaller 10 times to 100 times than the thickness t1 of the light emitting unit 100. Since the thickness t3 of the wiring unit 200 is smaller than the thickness t1 of the light emitting unit 100, according to Equation (1), the corrugation period of the wiring unit 200 may be smaller than that of the light emitting unit 100. In other words, the wiring unit 200 may be further bended than the light emitting unit 100. For example, when the thickness t3 of the wiring unit 200 may be smaller 100 times than the thickness t1 of the light emitting unit 100, and when the corrugation period of the light emitting unit 100 is 500 μm, the corrugation period of the wiring unit 200 may be 5 μm. Accordingly, the corrugation of the wiring unit 200 may be denser than that of the light emitting unit 100.

The insulation layer 230 of the wiring unit 200 includes a polymer resin, and the buffer layer 110 of the light emitting unit 100 includes an inorganic material, the modulus of elasticity of the insulation layer 230 may be relatively smaller than that of the buffer layer 110. For example, the modulus of elasticity of the insulation layer 230 may be 1 GPa to 10 GPa, and the modulus of elasticity of the buffer layer 110 may be 100 GPa to 1 TPa. Accordingly, the modulus of elasticity of the wiring unit 200 may be relatively smaller than that of the light emitting unit 100. Since the modulus of elasticity of the wiring unit 200 is smaller than that of the light emitting unit 100, according to Equation (1), the corrugation period of the wiring unit 200 may be smaller than that of the light emitting unit 100. In other words, the wiring unit 200 may be further bended than the light emitting unit 100.

A stretchable display according to an embodiment of the inventive concept may be stretched in a horizontal direction by an external force. For example, the stretchable display may be stretched until the corrugations of the light emitting unit 100 and the wiring unit 200 disappear. In other words, the stretchable display may be stretched until the light emitting unit 100 and the wiring unit 200 become even.

As described above, since the wiring unit 200 may be further bended than the light emitting unit 100, the wiring unit 200 may be further stretched than the light emitting unit 100. In other words, for the maximally stretched length, the wiring unit 200 may be larger than the light emitting unit 100. Accordingly, the light emitting element 120 included in the light emitting unit 100 may be less affected by the stretch of the stretchable display. For example, the light emitting element 120 included in the light emitting unit 100 may have a small angle change according to the stretch of the stretchable display. Accordingly, the light emission characteristics of the light emitting element 120 may exhibit an effect that a change amount according to the stretch and recovery of the stretchable display is minimized. For example, the light emission characteristics may be represented as color coordinates or luminance. For example, in case of an OLED, the light emitting element 120 may include a resonance structure that is sensitive to an angle change. Accordingly, an effect of minimizing the change amount in the light emission characteristics may be larger according to the small angle change.

The plurality of light emitting units 100 may be disposed regularly. In other words, the distance that two adjacent light emitting units 100 are separated in a plane may be regular. Accordingly, the shape and magnitude of the corrugation of the wiring unit 200 may be regular in a state where the stretchable display is not stretched.

Figure 3A:
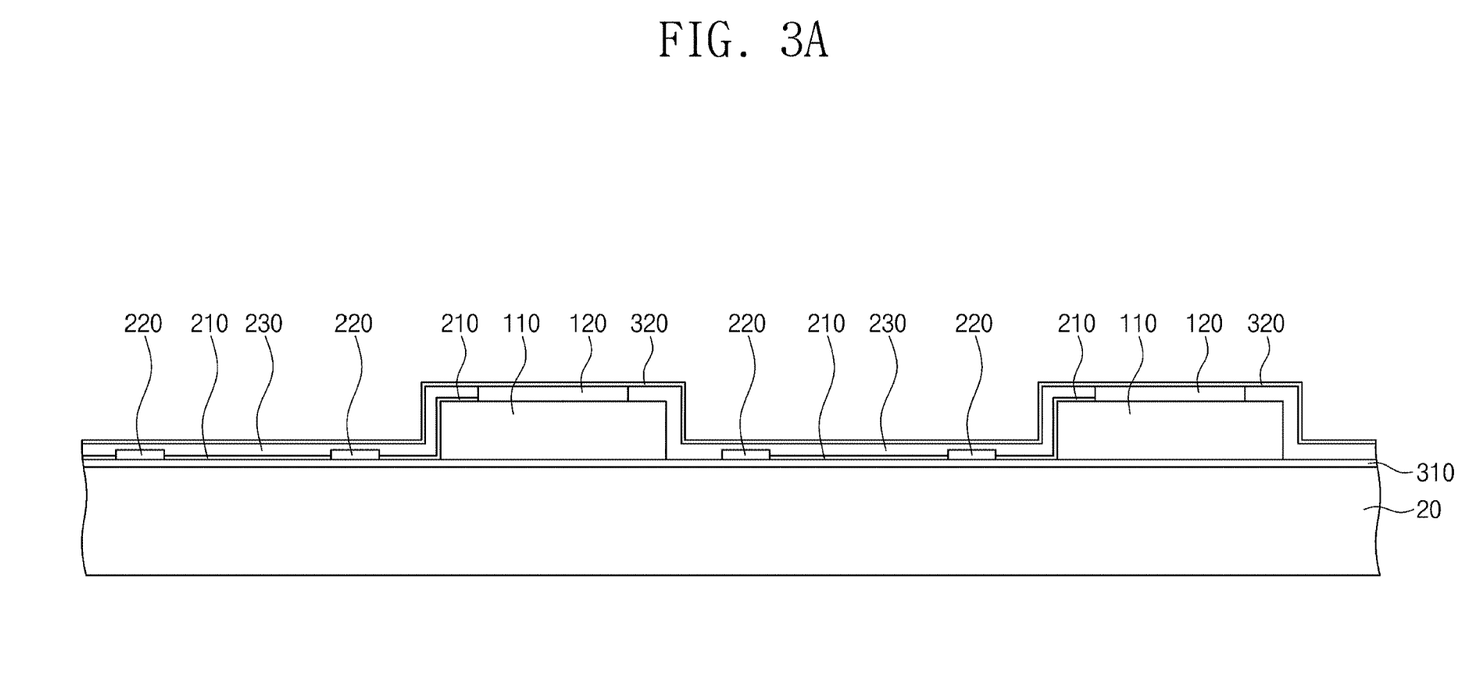
FIGS. 3A and 3B are cross-sectional views for explaining a manufacturing method of a stretchable display according to an embodiment of the inventive concept.
Figure 3B:
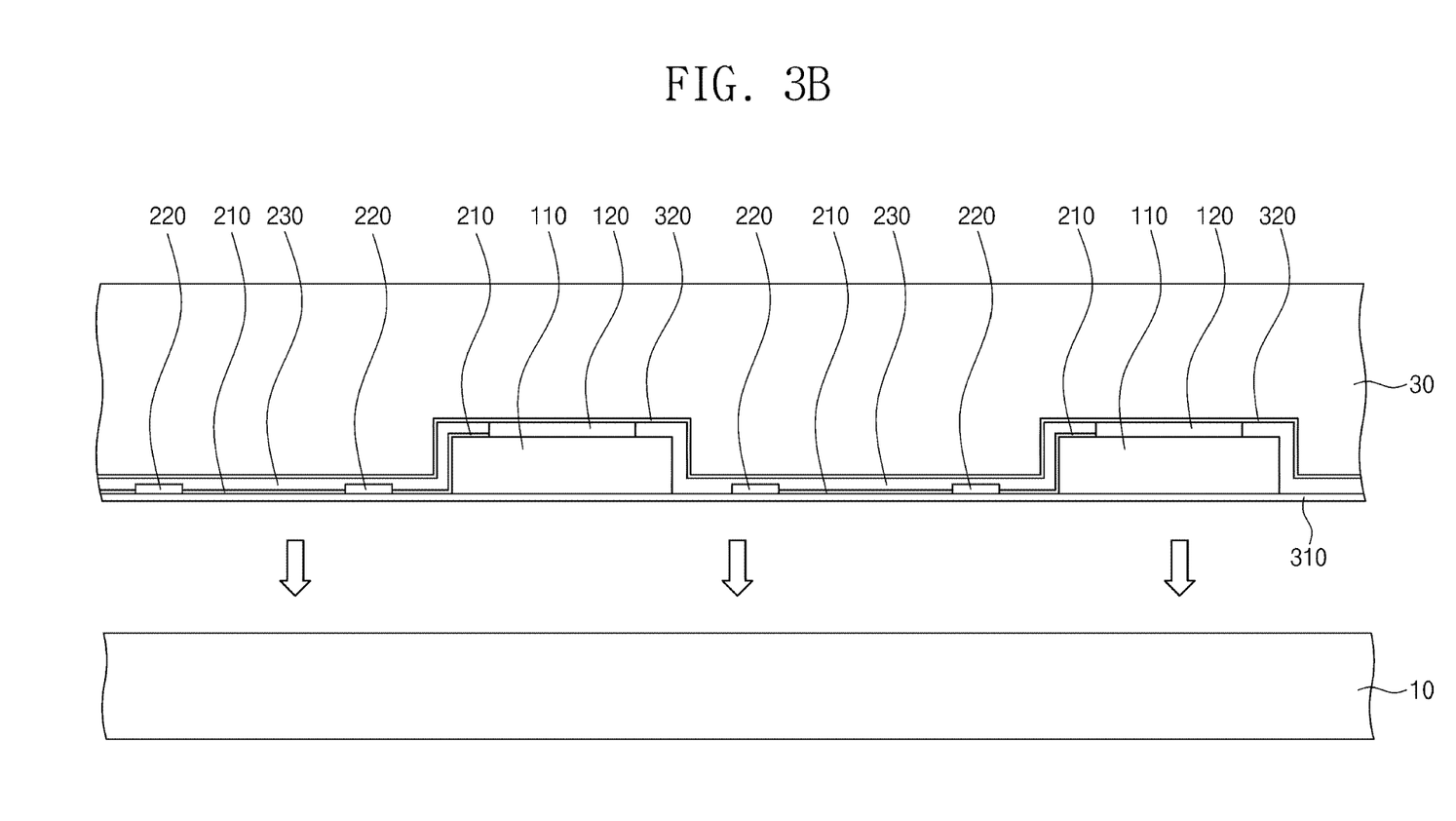

FIGS. 3A and 3B are cross-sectional views for explaining a manufacturing method of a stretchable display according to an embodiment of the inventive concept.

In relation to FIG. 3A, the substrate 310 may be formed on a carrier glass 20. Then, the buffer layer 100, the wiring 210 and the driving element 220 may be formed on the substrate 310. Thereafter, the light emitting element 120 may be formed on the buffer layer 110, and the insulation layer 230 may be formed to cover the driving element 220 and the wiring 210. Subsequently, the encapsulation layer 320 may be formed to cover the light emitting element 120 and the insulation layer 230.

In relation to FIG. 3B, laser may be irradiated between the carrier glass 20 and the substrate 310 to detach the substrate 310, the buffer layer 110, the light emitting element 120, the wiring 210, the driving element 220, the insulation layer 230, and the encapsulation layer 320 from the carrier glass 20. Then a sacrificial layer 30 may be formed on the encapsulation layer 320. Subsequently, the sacrificial layer 30 may be gripped to transfer the substrate 310, the buffer layer 110, the light emitting element 120, the wiring 210, the driving element 220, the insulation layer 230, and the encapsulation layer 320 onto the elastic body 10. At this point, the elastic body 10 may be stretched in a horizontal layer. For example, the top portion of the elastic body 10 may be adhesive to make the transfer easy. For another example, a relatively thin adhesive layer is provided on the elastic body 10 to make the transfer easy. When the transfer is completed, the sacrificial layer 30 may be removed. Thereafter, when the stretched elastic body 10 is recovered, a corrugation structure may be formed on the light emitting unit 100 and the wiring unit 200 as shown in FIGS. 2A and 2B.

In a stretchable display according to embodiments of the present disclosure, a light emitting unit has a larger corrugation period than that of a wiring unit, and thus an amount of a light emitting characteristic change of a light emitting element may be minimized according to the stretchability thereof.

Although the exemplary embodiments of the present invention have been described, it is understood that the present invention may be implemented as other concrete forms without changing the inventive concept or essential features. Therefore, these embodiments as described above are only proposed for illustrative purposes and do not limit the present disclosure.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A stretchable display comprising: an elastic body;
a light emitting unit on a first surface of the elastic body; and
a wiring unit on the first surface of the elastic body, wherein the light emitting unit comprises: a first portion of a substrate on the elastic body;
a buffer layer on the first portion of the substrate; and
a light emitting element on the buffer layer, the wiring unit comprises:
a second portion of the substrate on the elastic body adjacent to the first portion of the substrate;
a driving element on the second portion of the substrate spaced apart from the buffer layer in a direction along the first surface of the elastic body, the driving element configured to control the light emitting element;
a wiring on the second portion of a substrate configured to electrically connect the driving element and the light emitting element; and
an insulation layer configured to cover the driving element and the wiring, a first portion of the insulation layer on the second portion of the substrate,
the light emitting unit and the wiring unit have respective corrugation structures, such that the first surface of the elastic body has a wave shape and the corrugation structures of the light emitting unit and the wiring unit are wave shapes that correspond to the wave shape of the first surface of the elastic body, a second portion of the insulation layer extends into the light emitting unit to cover a portion of the buffer layer, a thickness of the light emitting unit, from the first surface of the elastic body to a top surface of the second portion of the insulation layer in the light emitting unit, is larger than that of the wiring unit, from the first surface of the elastic body to a top surface of the first portion of the insulation layer in the wiring unit, a modulus of elasticity of the buffer layer is larger than that of the insulation layer, and a modulus of elasticity of the elastic body is smaller than that of the insulation layer.

2. The stretchable display of claim 1, wherein a thickness of the buffer layer is larger than that of the insulation layer.

3. The stretchable display of claim 1, wherein a corrugation period of the light emitting unit is larger than that of the wiring unit.

4. The stretchable display of claim 1, wherein the buffer layer comprises one of an inorganic material and an organic and inorganic composite material, and
the insulation layer comprises a polymer resin.

5. The stretchable display of claim 1, wherein a thickness of the light emitting unit is 10 times to 100 times larger than that of the wiring unit.

6. The stretchable display of claim 2, wherein a thickness of the buffer layer is 10 times to 100 times larger than that of the insulation layer.

7. The stretchable display of claim 1, wherein the first substrate unit and the second substrate unit comprises one among a polyimide resin, a polyethylene terephthalate (PET) resin, a polyethersulfone (PES) resin, and a ploycarbonate resin.

8. The stretchable display of claim 1, wherein the wiring unit surrounds the light emitting unit in a planar manner.

9. The stretchable display of claim 1, wherein the light emitting unit further comprises a first encapsulation unit configured to cover the light emitting element, and
the wiring unit further comprises a second encapsulation layer configured to cover the insulation layer.

10. The stretchable display of claim 1, wherein a top portion of the elastic body has adhesive property.

11. The stretchable display of claim 1, further comprising:
an adhesive layer provided between the elastic body and the first portion of the substrate and between the elastic body and the second portion of the substrate.

12. The stretchable display of claim 1, further comprising:
an encapsulation layer covering each of the light emitting unit and the wiring unit,
wherein a distance from the first surface of the elastic body to the encapsulation layer is greater in the light emitting unit than in the wiring unit.

13. The stretchable display of claim 1, wherein the insulation layer contacts a side of the light emitting element, and
each of the insulation layer and the light emitting element contacts a same surface of the buffer layer opposite the elastic layer.

* * * * *